United States Patent
Ku et al.

(10) Patent No.: US 10,460,797 B2
(45) Date of Patent: Oct. 29, 2019

(54) METHOD FOR PROGRAMMING NON-VOLATILE MEMORY AND MEMORY SYSTEM

(71) Applicant: MACRONIX INTERNATIONAL CO., LTD., Hsinchu (TW)

(72) Inventors: Shaw-Hung Ku, Hsinchu (TW); Ta-Wei Lin, Taipei (TW); Cheng-Hsien Cheng, Yunlin County (TW); Chih-Wei Lee, New Taipei (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/698,812

(22) Filed: Sep. 8, 2017

(65) Prior Publication Data

US 2019/0080750 A1 Mar. 14, 2019

(51) Int. Cl.
*G11C 16/04* (2006.01)
*G11C 11/56* (2006.01)
*G11C 16/34* (2006.01)

(52) U.S. Cl.
CPC ...... *G11C 11/5628* (2013.01); *G11C 16/3459* (2013.01); *G11C 2211/5621* (2013.01)

(58) Field of Classification Search
CPC ............. G11C 11/5628; G11C 16/3459
USPC ..................................... 365/185.03
See application file for complete search history.

(56) References Cited

U.S. PATENT DOCUMENTS

| 7,457,178 | B2 | 11/2008 | Tu et al. |
| 7,468,924 | B2 | 12/2008 | Kwon |
| 7,599,219 | B2 * | 10/2009 | Kim ................. G11C 16/12 365/185.19 |
| 9,466,376 | B1 | 10/2016 | Lee et al. |
| 2008/0123411 | A1 * | 5/2008 | Crippa ............... G11C 7/1021 365/185.03 |

(Continued)

FOREIGN PATENT DOCUMENTS

TW 201642267 A 12/2016

OTHER PUBLICATIONS

TIPO Office Action dated May 9, 2015 in Taiwan application (No. 106130955).

(Continued)

*Primary Examiner* — Huan Hoang
(74) *Attorney, Agent, or Firm* — McClure, Qualey & Rodack, LLP

(57) ABSTRACT

A method for programming a non-volatile memory and a memory system are provided. Each of multiple cells of the non-volatile memory stores data having at least 2 bits. The method includes the following steps. At least one programming pulse is provided for programming a target cell of the cells. At least one program-verify pulse is provided for verifying whether the target cell is successfully programmed. It is determined that whether a threshold voltage of the target cell is greater than or equal to a program-verify voltage. When the threshold voltage is greater than or equal to the program-verify voltage, the target cell is set as successfully programmed. Next, a post-verifying operation is performed to the successfully programmed cell. The post-verifying operation includes determining whether the threshold voltage of the target cell is greater than or equal to a post-verifying voltage.

12 Claims, 4 Drawing Sheets

(56) References Cited

U.S. PATENT DOCUMENTS

| | | | |
|---|---|---|---|
| 2008/0158993 A1* | 7/2008 | Jung | G11C 16/3454 |
| | | | 365/185.22 |
| 2009/0059671 A1 | 3/2009 | Park et al. | |
| 2010/0232228 A1 | 9/2010 | Jeon et al. | |
| 2010/0246272 A1* | 9/2010 | Lee | G11C 16/3454 |
| | | | 365/185.19 |
| 2011/0096598 A1* | 4/2011 | Takeuchi | G11C 7/1051 |
| | | | 365/185.03 |
| 2011/0194353 A1 | 8/2011 | Hwang et al. | |
| 2012/0155186 A1 | 6/2012 | Chokan et al. | |
| 2013/0021849 A1 | 1/2013 | Li | |
| 2013/0235662 A1 | 9/2013 | Fujiu | |
| 2016/0093380 A1 | 3/2016 | Dong et al. | |
| 2017/0148525 A1 | 5/2017 | Kathawala et al. | |

OTHER PUBLICATIONS

Chinese language office action dated Nov. 19, 2018, issued in application No. TW 107111946.
Suh, K.D., et al.; "A 3.3 V 32 Mb NAND flash memory with incremental step pulse programming scheme;" IEEE Journal of Solid-State Circuits; vol. 30; No. 11; Nov. 1995; pp. 1149-1156.
Non-Final Office Action dated Dec. 4, 2018, issued in U.S. Appl. No. 15/939,359.

\* cited by examiner

METHOD FOR PROGRAMMING NON-VOLATILE MEMORY AND MEMORY SYSTEM

TECHNICAL FIELD

The disclosure relates to a non-volatile memory, especially a method for programming a non-volatile memory and a memory system.

BACKGROUND

In the recent years, non-volatile memories are commonly used in various electronic devices, such as personal computers, laptop computers, smart phones, tablets, and etc. A non-volatile memory includes an array of memory cells. The volume of a non-volatile memory is getting smaller, and for the purpose of increasing the density of a memory, more bits are stored in one memory cell. Multi-Level-Cell (MLC) technology is adopted to increase the density of the memory.

Based on the quantum mechanics, as known as quantum physics, when the volume of the memory is getting smaller, the effect of a quantum in a memory is becoming more significant. A noise fluctuation in reading a cell of the memory will influence the reliability of the memory.

Therefore, there is a need to provide a method for programming a non-volatile memory and a memory system to reduce the effect of the noise fluctuation in reading a cell of the memory.

SUMMARY OF THE INVENTION

The invention is related to a method for programming a non-volatile memory and a memory system. By means of the present invention, a post-verifying pulse would be applied on memory cells of a non-volatile memory which have set as programmed successfully, and a post-programming pulse would be applied on some target memory cells of the memory cells programmed successfully to program these target memory cells and upgrade the threshold voltage of these target cells. The cell Vt distributions containing these target cells would be shrank and compact, and the effect of the noise fluctuation in the reading of the target cells would be reduced.

According to the first aspect of the present invention, a method for programming a non-volatile memory in a programming operation is provided. Each of part of a plurality of cells of the non-volatile memory stores data having at least 2 bits. The method comprises the following steps. At least one programming pulse is provided for programming a target cell of the cells. At least one program-verify pulse is applied to the target cell. The target cell is set as successfully programmed in condition that a threshold voltage of the target cell is greater than or equal to a program-verify voltage. A post-verifying operation is performed to the target cell in condition that the target cell is set as successfully programmed. The post-verifying operation comprises applying at least one post-verifying pulse to the target cell.

According to the second aspect of the present invention, a method for programming a non-volatile memory in a programming operation is provided. Each of part of a plurality of cells of the non-volatile memory stores data having at least 2 bits. The method comprises the following steps. At least one programming pulse is provided. At least one program-verify pulse is provided. A program-pass signal is enabled. At least one post-verifying pulse is provided after enabling the program-pass signal.

According to the third aspect of the present invention, a memory system is provided. The memory system comprises a non-volatile memory array and a controller. The non-volatile memory array includes a plurality of memory blocks, and each of the memory blocks includes a plurality of memory pages. Each of the memory pages includes a plurality of memory cells, and each of the memory cells stores data having at least 2 bits. The controller is coupled to the non-volatile memory array. The controller provides at least one programming pulse to program a target cell of the cells and applies at least one program-verify pulse to the target cell. The controller sets the target cell as successfully programmed in condition that a threshold voltage of the target cell is greater than or equal to a program-verify voltage and performs a post-verifying operation to the target cell in condition that the target cell is set as successfully programmed. The post-verifying operation comprises that the controller applies at least one post-verifying pulse to the target cell.

The above and other aspects of the invention will become better understood with regard to the following detailed description of the preferred but non-limiting embodiment(s). The following description is made with reference to the accompanying drawings.

Figure 1A:
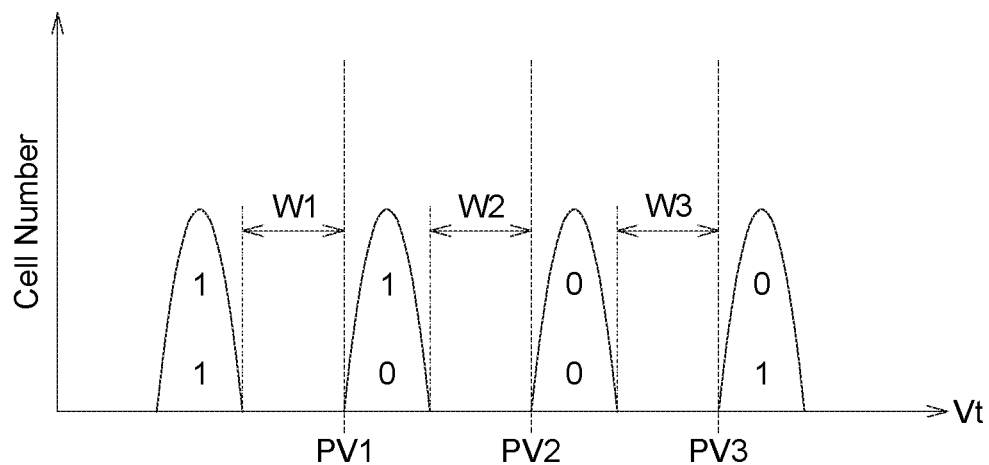
FIG. 1A shows a diagram illustrating a distribution of threshold voltages (Vt) for multi-level cells (MLC) according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please referring to FIG. 1A, FIG. 1A shows a diagram illustrating a distribution of threshold voltages (Vt) for multi-level cells (MLC) according to one embodiment of the present disclosure. In this example, each memory cell of a non-volatile memory array stores 2-bit data, and each of MLC has four logical states, namely "11", "10", "00", and "01", to represent 2-bit data per cell, as shown in FIG. 1A. In this example, the program-verify voltage PV1 is used to determine the low boundary of cell Vt distribution of logical state "10". Similarly, the program-verify voltages PV2 and PV3 respectively are used to determine the low boundaries of cell Vt distributions of logical states "00" and "01". A region between the high boundary of cell Vt distribution of logical state "11" and the low boundary of cell Vt distribution of logical state "10" is defined as a window W1. A region between the high boundary of cell Vt distribution of logical state "10" and the low boundary of cell Vt distribution of logical state "00" is defined as a window W2. A region between the high boundary of cell Vt distribution of logical state "00" and the low boundary of cell Vt distribution of logical state "01" is defined as a window W3.

Figure 1B:
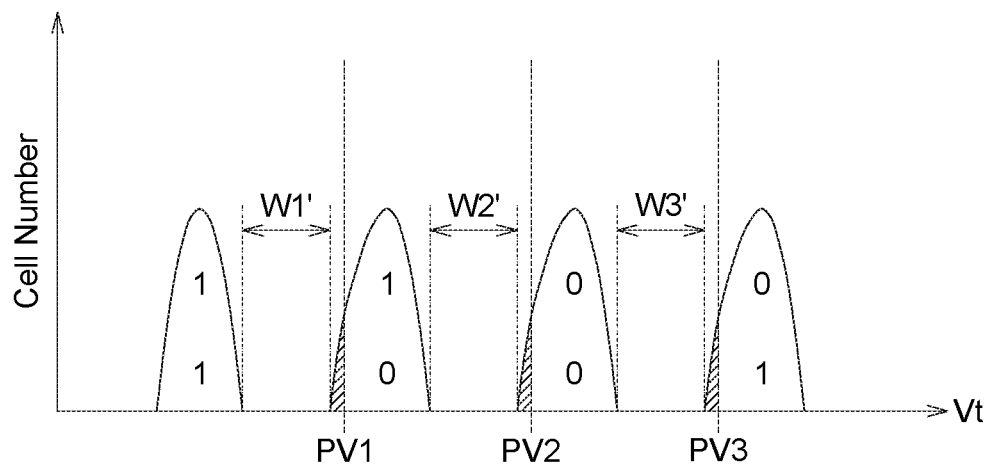
FIG. 1B shows a diagram illustrating a distribution of threshold voltages (Vt) for multi-level cells (MLC) according to one embodiment of the present invention.

Please refer to FIG. 1B illustrating a distribution of threshold voltages (Vt) for multi-level cells (MLC) according to one embodiment of the present disclosure. Because of the feature of random telegraph noise (RTN) of memory cells, the cell Vt distribution of logical state "10" would has a "tail" portion lower than the program-verify voltage PV1, and the cell Vt distributions of logical states "00" and "01" also have "tail" portions lower than the program-verify voltages PV2 and PV3 respectively. The noise fluctuation of the cells results in that each of the cell Vt distributions may have an additional "tail" which is shaded in grey for easy reference. The "tail" portions of the cell Vt distributions will narrow down the windows W1, W2 and W3. The widths of windows W1', W2' and W3' in FIG. 1B are less than the widths of the windows W1, W2 and W3 in FIG. 1A respectively. The window W1' is the region between the high boundary of cell Vt distribution of logical state "11" and the low boundary of cell Vt distribution of logical state "10" having a "tail" in FIG. 1B. The window W2' is the region between the high boundary of cell Vt distribution of logical state "10" and the low boundary of cell Vt distribution of logical state "00" having a "tail" in FIG. 1B. The window W3' is the region between the high boundary of cell Vt distribution of logical state "00" and the low boundary of cell Vt distribution of logical state "01" having a "tail" in FIG. 1B.

Figure 1C:
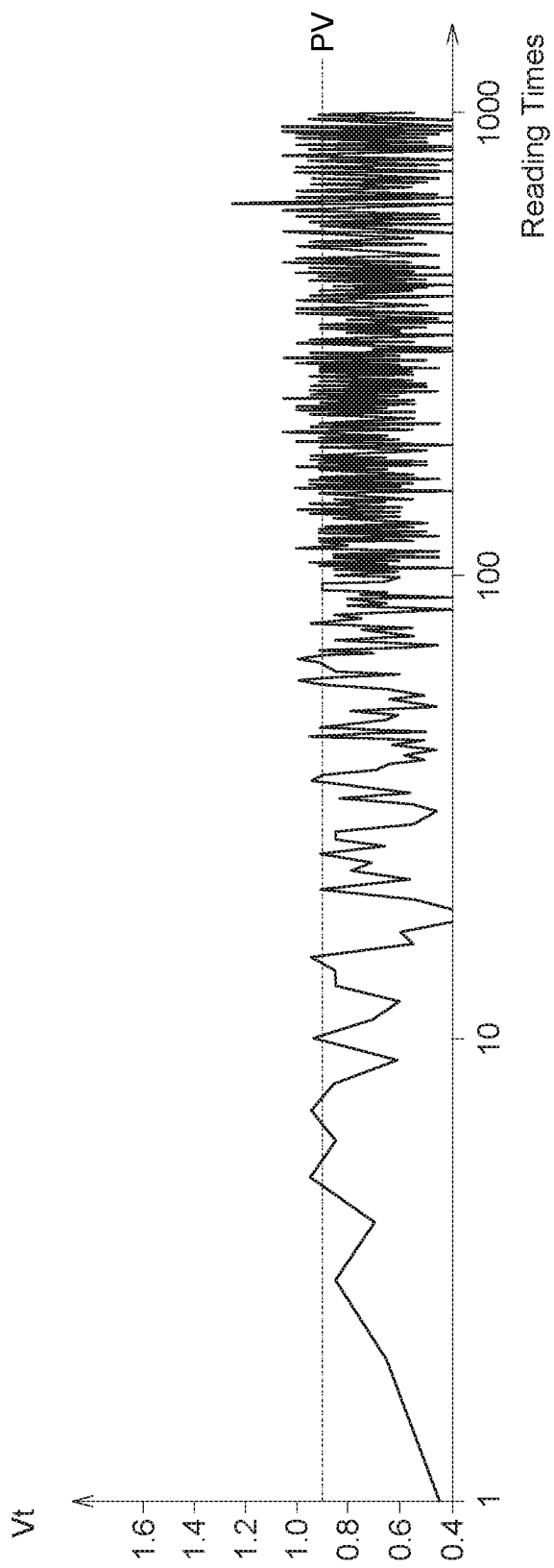
FIG. 1C shows a diagram illustrating a noise fluctuation in the reading of a cell according to one embodiment of the present invention.

FIG. 1C shows a diagram illustrating a noise fluctuation in the reading of a cell which is located in the "tail" portion of the cell Vt distributions in FIG. 1B according to one embodiment of the present invention. It is illustrated that the threshold voltage of the cell is less than the program-verify voltage PV at the first reading, but the threshold voltage of the cell is greater than the program-verify voltage PV at the tenth reading. This means the threshold voltage of the cell within the "tail" portion is sometimes less than the program-verify voltage PV and sometimes greater than the program-verify voltage PV. There are wild variations in the threshold voltage of the cell, and a noise fluctuation could be observed in the electrical property of the cell. The noise fluctuation would influence the widths of the windows.

Figure 2:
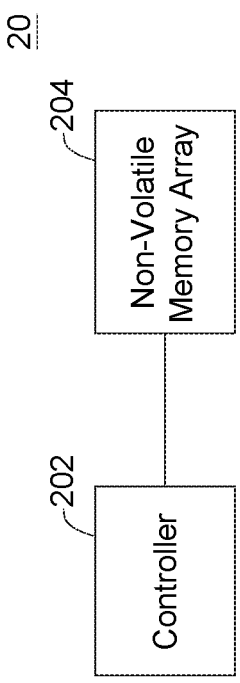
FIG. 2 is a block diagram illustrating a memory system according to one embodiment of the present disclosure.

FIG. 2 is a block diagram illustrating a memory system 20 according to one embodiment of the present invention. The memory system 20 includes a controller 202 and a non-volatile memory array 204. The non-volatile memory array 204 can retain its information when the power is turned off. The non-volatile memory array 204 includes a plurality of memory blocks, and each of the memory blocks includes a plurality of memory pages. Each of the memory pages includes a plurality of memory cells. For example, the non-volatile memory array 204 is read-only memory (ROM), programmable read-only memory (PROM), electrically alterable read only memory (EAROM), erasable programmable read only memory (EPROM), electrically erasable programmable read only memory (EEPROM), or any type of 2D and 3D flash memory.

The control 202 is coupled to the non-volatile memory array 204. For example, the controller 202 can be implemented by a chip, a circuit block in a chip, a circuit board including a number of electric elements and a number of conductive wires, or a computer readable medium storing a number of program codes. The control 202 is used to control the operation mode of the non-volatile memory array 204 in response to some external instructions from an interface (not shown in FIG. 2) via a bus. For example, the interface is an input/out interface. The operation mode is one of programming (writing) operation, reading operation, and erasing operation.

The controller 202 provides at least one programming pulse to program cells of the non-volatile memory array 204 and provides at least one program-verify pulse to verify whether the programmed cells are successfully programmed. For example, in FIGS. 1A and 1B, the program-verify voltage PV3 is used to verify whether the memory cell which is expected to be programmed to state "01" is programmed successfully. The program-verify voltage PV2 is used to verify whether the memory cell which is expected to be programmed to state "00" is programmed successfully. The program-verify voltage PV1 is used to verify whether the memory cell which is expected to be programmed to state "10" is programmed successfully.

Take each memory cell of the non-volatile memory array 204 storing 2-bit data with four states, as shown in FIGS. 1A and 1B, as an example. In a programming operation, when the multi-level cell which should be programmed to state "10" is programmed to state "11", the multi-level cell is set as programmed unsuccessfully or programmed failed. Similarly, the multi-level cell which should be programmed to state "00" but is programmed to state "11" or state "10", and the multi-level cell which should be programmed to state "01" but is programmed to state "11", state "10" or state "00" would be set as programmed unsuccessfully as well.

Figure 3:
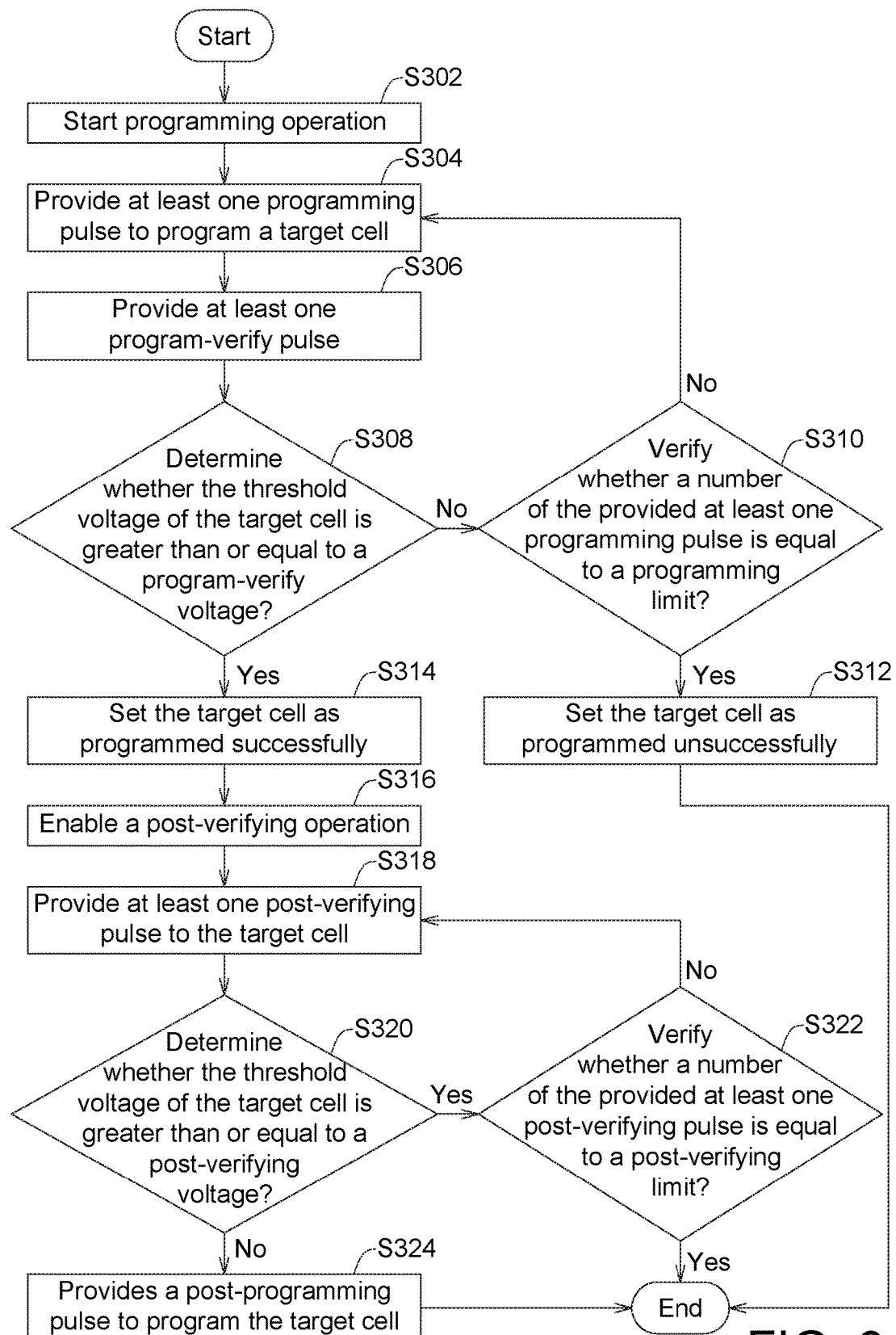
FIG. 3 illustrates a flow diagram for a method for programming a non-volatile memory according to one embodiment of the present disclosure.

Please refer to FIG. 3 which illustrates a flow diagram for a method for programming a non-volatile memory according to one embodiment of this invention. To clearly illustrate the operation of the various elements of the above-described embodiments and the present embodiment, the method for programming the non-volatile memory is described with the following detailed description of a flowchart below. However, those skilled in the art can understand, the method of the present embodiment is applied but not limited to the memory system 20 in FIG. 2, and it is not limited to the order of the steps of the flowchart. Although the example technique involves operations being performed in a specific order, variants of the technique according to some embodiments can involve these or different operations being performed in different orders.

Figure 4:
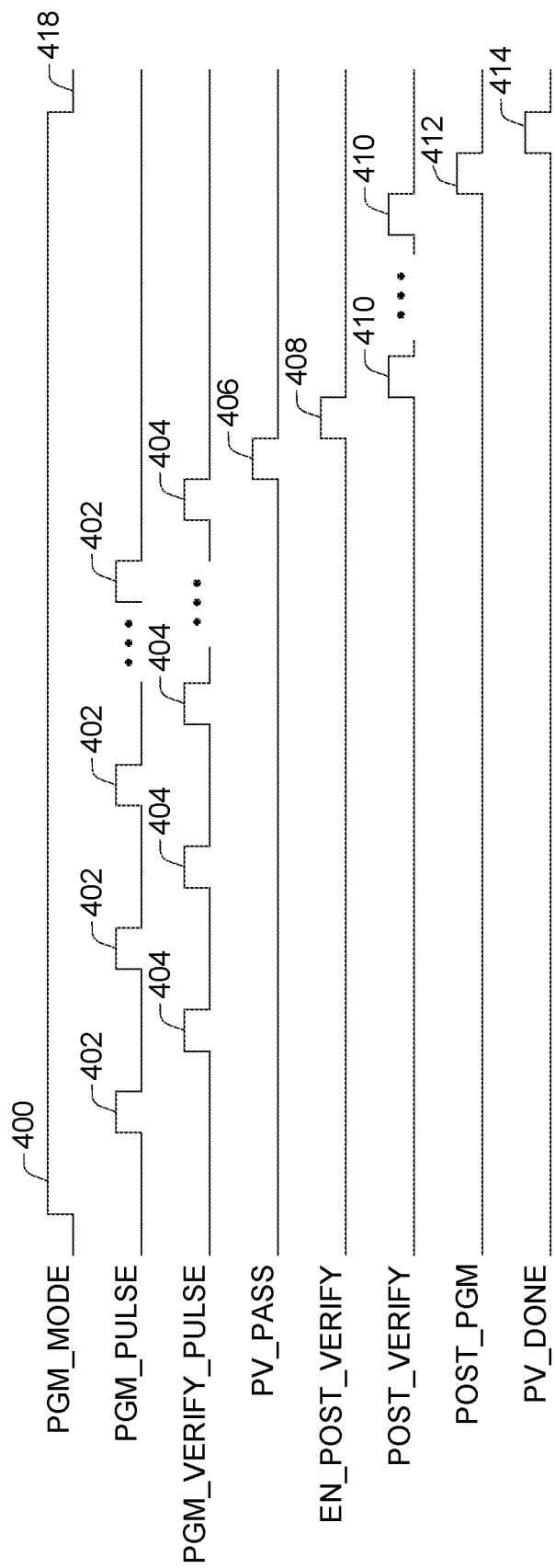
FIG. 4 illustrates a waveform of signals according one embodiment of the present disclosure.

Please refer to FIGS. 2, 3, and 4. FIG. 4 illustrates a waveform of signals according an embodiment of this disclosure. According to an embodiment of the present invention, at step S302, the controller 202 receives an instruction of programming mode from an interface to change the operation mode of the non-volatile memory array 204 to a programming operation, and a program-verify operation is enabled. The program-verify operation includes programming a target cell of the cells of the non-volatile memory array 204 and verifying whether the target cell is successfully programmed. During the programming operation, the following operations, steps S304 to S324, are performed.

At step S304, the controller 202 provides at least one programming pulse (for example, the pulse 402 in FIG. 4) to program the target cell of the cells of the non-volatile memory array 204 and then the controller 202 provides at least one program-verify pulse (for example, the pulse 404 in FIG. 4) to the target cell to verify whether the programmed target cell is successfully programmed at step S306. This is that at least one program-verify pulse is applied to the target cell to verify whether the target cell is successfully programmed. Next, at step S308, the controller 202 determines whether the threshold voltage of the target cell is greater than or equal to a program-verify voltage PV. In one embodiment of the present invention, the controller 202 may provide a erasing pulse to erase the cells of the non-volatile memory array 204 before providing the at least one programming pulse to program the target cell.

If the threshold voltage of the target cell is less than the program-verify voltage PV (the result of step S308 is No), the process proceeds to step S310. At step S310, the controller 202 verifies whether a number of the provided at least one programming pulse (for example, the pulse 402 in FIG. 4) is equal to a programming limit. When the number of the provided at least one programming pulse is less than the programming limit, the process proceeds to step S304. When the number of the provided at least one programming pulse is equal to the programming limit, the process proceeds to step S312. At step S312, the controller 202 sets the target cell as programmed unsuccessfully.

If the threshold voltage of the target cell is greater than or equal to the program-verify voltage PV (the result of step S308 is Yes), the process proceeds to step S314. At step S314, the controller 202 enables a program-pass signal (for example, PV_PASS signal 406 in FIG. 4) to set the target cell as programmed successfully. In other words, the target cell is set as successfully programmed in condition that the threshold voltage of the target cell is greater than or equal to the program-verify voltage PV. After step S314, the controller 202 enables a post-verifying operation to the target cell at step S316. The post-verifying operation comprises applying at least one post-verifying pulse to determine whether the threshold voltage of the target cell is greater than or equal to a post-verifying voltage. At step S318, the controller 202 provides at least one post-verifying pulse (for example, pulse 410 in FIG. 4) to the target cell for determining whether the threshold voltage of the target cell is greater than or equal to a post-verifying voltage. At step S320, the controller 202 determines whether the threshold voltage of the target cell is greater than or equal to the post-verifying voltage.

If the threshold voltage of the target cell is greater than or equal to the post-verifying voltage (the result of step S320 is Yes), the process proceeds to step S322. At step S322, the controller 202 verifies whether a number of the provided at least one post-verifying pulse (for example, the pulse 410 in FIG. 4) is equal to a post-verifying limit. When the number of the provided at least one post-verifying pulse is less than the post-verifying limit (the result of step S322 is No), the process proceeds to step S318. When the number of the provided at least one post-verifying pulse is equal to the post-verifying limit (the result of step S322 is Yes), the process ends and the controller 202 ends the programming operation of the non-volatile memory array 204.

If the threshold voltage of the target cell is less than the post-verifying voltage (the result of step S320 is No), the process proceeds to step S324. At step S324, the controller 202 provides a post-programming pulse (for example, the pulse 412 in FIG. 4) for programming the target cell. In other words, the post-verifying operation further comprises providing the post-programming pulse for programming the target cell in condition that the threshold voltage of the target cell is less than the post-verifying voltage. The amplitude of the post-programming pulse is greater than the amplitude of the at least one programming pulse. There is a difference $\Delta V$ between the amplitude of the post-programming pulse and the amplitude of the at least one programming pulse. In this embodiment of the present invention, the amplitude of the post-verifying pulse is equal to the amplitude of the program-verify pulse. In other embodiments of this invention, the amplitude of the post-verifying pulse could be greater than or less than the amplitude of the program-verify pulse.

In the present invention, the post-verifying limit could be a positive integer, such as 1, 2, 5, and etc. For example, the post-verifying limit is set to 5. When the target cell of the non-volatile memory array 204 is set as programmed successfully, the controller 202 provides the post-verifying pulse to the target cell to determine whether the threshold voltage of the target cell is greater than or equal to the post-verifying voltage. It is the first time to provide the post-verifying pulse. If the threshold voltage of the target cell is greater than or equal to the post-verifying voltage, the controller 202 provides the post-verifying pulse to the target cell again and determines whether the threshold voltage of the target cell is greater than or equal to the post-verifying voltage. It is the second time to provide the post-verifying pulse. After providing the post-verifying pulse to the target cell twice, if the threshold voltage of the target cell is less than the post-verifying voltage, the controller 202 provides the post-programming pulse to the target cell to program the target cell and upgrade the threshold voltage of the target cell. In this example, the post-verifying pulse is only provided twice, less than the post-verifying limit, 5. This means that after the post-verifying pulse is provided to the target cell and it is determined that the threshold voltage of the target cell is less than the post-verifying voltage, the controller 202 would provide the post-programming pulse to the target cell to program the target cell and upgrade the threshold voltage of the target cell and the process ends no matter whether the number of the provided post-verifying pulse is equal to the post-verifying limit which is 5.

Based on the above, if it is determined that the threshold voltage of the target cell is greater than or equal to the post-verifying voltage and the post-verifying limit is greater than 1, the controller 202 could continue providing the at least one post-verifying pulse to verify whether the threshold voltage of the target cell is greater than or equal to the post-verifying voltage until the threshold voltage of the target cell is determined as less than the post-verifying voltage or the number of the provided the at least one post-verifying pulses is equal to the post-verifying limit.

FIG. 4 illustrates a waveform of signals according an embodiment of this disclosure. Please refer to FIGS. 2, 3, and 4. PGM_MODE signal is enabled (for example, PGM_MODE signal changes to high voltage level 400) when the controller 202 receives a programming mode instruction from an interface. The controller 202 provides at least one programming pulse 402 of PGM_PULSE signal to program a target cell of the cells of the non-volatile memory array 204. After providing the at least one programming pulse 402, the controller 202 provides at least one program-verify pulse 404 in PGM_VERIFY_PULSE signal to the target cell to verify whether the target cell is successfully programmed.

If the target cell is not programmed successfully, the controller 202 continues providing the at least one programming pulse 402 to program the target cell of the memory and the at least one program-verify pulse 404 to verify whether the target cell is successfully programmed.

When the target cell is programmed successfully, a PV_PASS signal provided by the controller 202 is enabled (for example, pulse 406). Then, a EN_POST_VERIFY signal provided by the controller 202 is enabled (for example, pulse 408) to perform a post-verifying operation, and the controller 202 provides at least one post-verifying pulse 410 in POST_VERIFY signal to the target cell to verify whether the threshold voltage of the target cell is greater than or equal to a post-verifying voltage after enabling the PV_PASS signal and the EN_POST_VERIFY signal, that is, the at least one post-verifying pulse 410 is provided after the pulses 406 and 408. If it is determined that the threshold voltage of the target cell is less than the post-verifying voltage, the controller 202 provides a post-programming pulse 412 in POST_PGM signal to program the target cell of the non-volatile memory array 204 and upgrade the threshold voltage of the target cell. The amplitude of post-programming pulse 412 is greater than the amplitude of the at least one programming pulse 402.

Then, the pulse 414 of PV_DONE signal is provided by the controller 202 to indicate the termination of a multi-times-verify operation including the program-verify operation and the post-verifying operation. Eventually, the programming operation of the non-volatile memory array 204 is finished and PGM_MODE signal is disabled (for example, PGM_MODE signal changes to low voltage level 418).

In the embodiments of the present invention, a post-verifying operation is performed to the target cell of the non-volatile memory array after the target cell is set as programmed successfully. A post-verifying pulse is provided after the target cell is set as programmed successfully and a post-programming pulse is provided to program the target cell and upgrade the threshold voltage of the target cell when the threshold voltage of the target cell is less than the post-verifying voltage. Thus, the upgraded threshold voltage of the target cell could be steadily greater than the low bound of the cell Vt distribution where the target cell is located. The tails of the cell Vt distributions would be shrank and the cell Vt distributions would be compact. The widths of the windows between the cell Vt distributions could be increased. The effect of the noise fluctuation in the reading of the target cell would be also reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a non-volatile memory in a programming operation, the non-volatile memory including a plurality of cells, each of the cells stores data having at least 2 bits, the method comprising:
providing at least one programming pulse for programming a target cell of the cells;
applying at least one program-verify pulse to the target cell;
setting the target cell as successfully programmed in condition that a threshold voltage of the target cell is greater than or equal to a program-verify voltage; and
performing a post-verifying operation to the target cell in condition that the target cell is set as successfully programmed, the post-verifying operation comprising applying at least one post-verifying pulse to the target cell, wherein an amplitude of the at least one post-verifying pulse is equal to an amplitude of the at least one program-verify pulse,
wherein when it is determined that the threshold voltage of the target cell is greater than or equal to a post-verifying voltage, providing the at least one post-verifying pulse at least twice to verify whether the threshold voltage of the target cell is greater than or equal to the post-verifying voltage before a post-programming pulse is provided until the threshold voltage of the target cell is determined as less than the post-verifying voltage or a number of the provided the at least one post-verifying pulses is equal to a post-verifying limit.

2. The method according to claim 1, wherein the post-verifying operation further comprises:
providing the post-programming pulse for programming the target cell in condition that the threshold voltage of the target cell is less than a post-verifying voltage.

3. The method according to claim 2, wherein an amplitude of the post-programming pulse is greater than an amplitude of the at least one programming pulse.

4. The method according to claim 1, further comprising:
erasing the cells before providing the at least one programming pulse.

5. A method for programming a non-volatile memory in a programming operation, the non-volatile memory having a plurality of cells, each of the cells storing data having at least 2 bits, the method comprising:
providing at least one programming pulse;
providing at least one program-verify pulse;
enabling a program-pass signal; and
providing at least one post-verifying pulse after enabling the program-pass signal, wherein an amplitude of the at least one post-verifying pulse is equal to an amplitude of the at least one program-verify pulse,
wherein when it is determined that the threshold voltage of the target cell is greater than or equal to a post-verifying voltage, providing the at least one post-verifying pulse at least twice to verify whether the threshold voltage of the target cell is greater than or equal to the post-verifying voltage before a post-programming pulse is provided until the threshold voltage of the target cell is determined as less than the post-verifying voltage or a number of the provided the at least one post-verifying pulses is equal to a post-verifying limit.

6. The method according to claim 5, further comprising:
providing the post-programming pulse after providing the at least one post-verifying pulse; and
enabling a verify-done signal after providing the at least one post-verifying pulse.

7. The method according to claim 6, further comprising:
providing an enable-post-verifying-operation signal after enabling the program-pass signal and before providing the at least one post-verifying pulse.

8. The method according to claim 6, wherein an amplitude of the post-programming pulse is greater than an amplitude of the at least one programming pulse.

9. A memory system, comprising:
a non-volatile memory array, including a plurality of memory blocks, each of the memory blocks including a plurality of memory pages, each of the memory pages including a plurality of memory cells, each of the memory cells storing data having at least 2 bits; and a controller, coupled to the non-volatile memory array, for providing at least one programming pulse to program a target cell of the cells, applying at least one program-verify pulse to the target cell, setting the target cell as successfully programmed in condition that a threshold voltage of the target cell is greater than or equal to a program-verify voltage, and performing a post-verifying operation to the target cell in condition that the target cell is set as successfully programmed, the post-verifying operation comprising applying, by the controller, at least one post-verifying pulse to the target cell, wherein an amplitude of the at least one post-verifying pulse is equal to an amplitude of the at least one program-verify pulse, wherein when it is determined that the threshold voltage of the target cell is greater than or equal to a post-verifying voltage, providing the at least one post-verifying pulse at least twice to verify whether the threshold voltage of the target cell is greater than or equal to the post-verifying voltage before a post-programming pulse is provided until the threshold voltage of the target cell is determined as less than the post-verifying voltage or a number of the provided the at least one post-verifying pulses is equal to a post-verifying limit.

10. The system according to claim 9, wherein the post-verifying operation further comprises that the controller provides the post-programming pulse for programming the target cell in condition that the threshold voltage of the target cell is less than a post-verifying voltage.

11. The system according to claim 10, wherein an amplitude of the post-programming pulse is greater than an amplitude of the at least one programming pulse.

12. The system according to claim 9, wherein the controller further erases the cells before providing the at least one programming pulse.

* * * * *